United States Patent [19]

Hanlon

[11] 4,190,098
[45] Feb. 26, 1980

[54] MULTIPLE COMPONENT CIRCUIT BOARD COOLING DEVICE

[75] Inventor: Alfred G. Hanlon, Poway, Calif.
[73] Assignee: NCR Corporation, Dayton, Ohio
[21] Appl. No.: 878,501
[22] Filed: Feb. 16, 1978
[51] Int. Cl.² ............................................. H01L 23/40
[52] U.S. Cl. ..................................... 165/1; 165/80 B; 357/81; 361/383
[58] Field of Search ............. 165/80, 185, 77, DIG. 3, 165/DIG. 7, 1, 80 B, 80 C; 174/16 HS; 357/81; 361/383, 386

[56] References Cited

U.S. PATENT DOCUMENTS

| | | | |
|---|---|---|---|
| 2,838,740 | 6/1958 | Larky et al. | 165/80 B |
| 2,840,629 | 6/1958 | Roth et al. | 165/80 B |
| 3,305,004 | 2/1967 | Barlowe | 165/80 B |
| 3,519,889 | 7/1970 | Monaco | 361/388 |
| 3,572,428 | 3/1971 | Monaco | 165/80 B |
| 3,874,443 | 4/1975 | Bayer | 174/16 HS |
| 4,041,524 | 8/1977 | Trunk et al. | 165/80 B |

Primary Examiner—Sheldon Richter
Attorney, Agent, or Firm—J. T. Cavender; Stephen F. Jewett; Edward Dugas

[57] ABSTRACT

A device for cooling a multiplicity of solid state components which are attached to a printed circuit board comprises a formed profile member of high thermal conductivity material having a pair of longitudinally connected sides which form a geometrically shaped channel extending along its entire length for dissipation of thermal energy away from the components. The sides of the device are formed to provide a resilient springlike characteristic for frictionally engaging and holding the device in intimate contact with the surfaces of the solid state components to be cooled. This same characteristic facilitates manual installation and removal of the cooling device without the need for or use of special tools.

5 Claims, 13 Drawing Figures

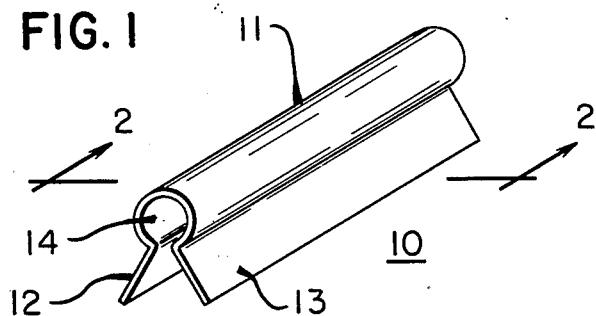
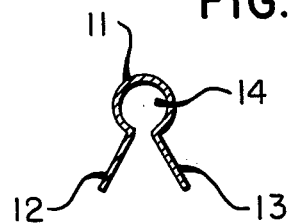
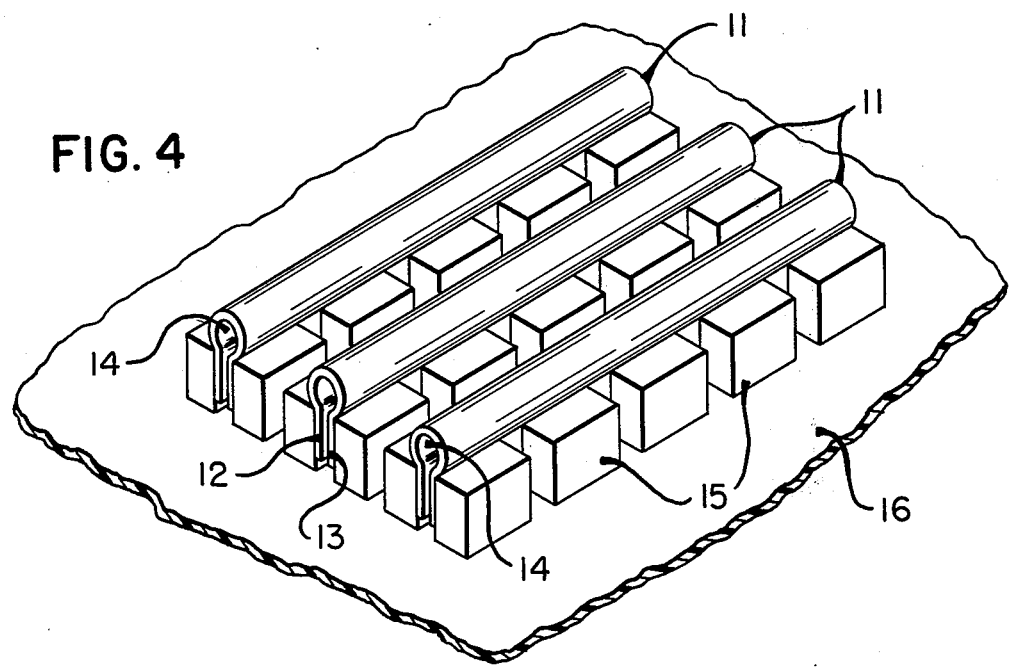
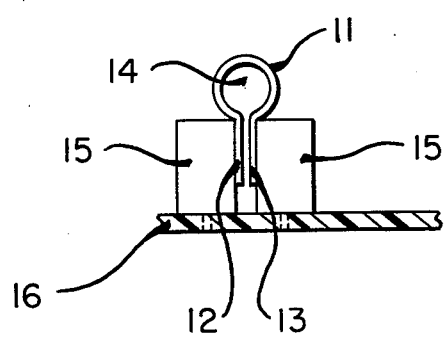

MULTIPLE COMPONENT CIRCUIT BOARD COOLING DEVICE

BACKGROUND OF THE INVENTION

The thrust in solid state technology is to provide increasing amounts of circuitry within single large scale integrated packages in order to conserve space, reduce cost and to enlarge capability and effectively in electronic systems. Coincident with the impetus to design ever increasing amounts of circuitry within large scale integrated packages is the trend to populate printed circuit boards with larger numbers of these packages of like kind, such as those used for memory arrays in computing systems. Although the increase in density both internally within the large scale integrated component package and the use of more packages per printed circuit board greatly conserves space and provides a lower cost per bit, such packaging generally increases heat generation to the extent that more costly and more complex methods of cooling printed circuit boards and their associated solid state components are generally required. Many ways have been conceived to provide heat sinks for individual circuit components. Normally these methods comprise a structure requiring some special considerations in the construction of the component which is to be cooled, such as the provision of a special tab which mates with the heat sink. To a large degree such devices are also equipped with locking mechanisms which help to maintain the intimate contact desired between the heat sink and the component. Such methods tend to increase the cost of manufacturing the circuit components and to complicate removal and replacement of the components in the event of failure. One such configuration is disclosed in U.S. Pat. No. 4,012,769, entitled "Heat Sink With Parallel Flat Faces", issued to Edwards and Pritchett.

The invention disclosed is constructed in such a manner as to provide for insertion of a thermal conductor tab which has been encapsulated into the semiconductor.

Another heat dissipating device with the same general characteristics is described in U.S. Pat. No. 4,041,524, entitled "Heat Dissipating Device For Transistor With Outwardly Extending Heat Conducting Tab", issued to Trunk and Skrobisch. In the referenced patent, the device is a wing or tab which protrudes from the casing in which the transistor is mounted over which the heat sink is mounted. A device having similar characteristics and similar requirements for special component construction is disclosed in U.S. Pat. No. 3,893,161, entitled "Frictionally Engageable Heat Sink For Solid State Devices", issued to Albert Pesak, Jr.

A removable heat sink which does not require special construction of the component is described in U.S. Pat. No. 3,572,428, entitled "Clamping Heat Sink", issued to A. T. Monaco. However, utilization of this particular device was not contemplated for cooling of a multiplicity of components densely packed in close proximity on a printed circuit board.

Devices for cooling multiple semiconductor components are described in U.S. Pat. No. 3,171,069, entitled "Diode Heat Sink Structure", issued to Koltuniak, et al., and in U.S. Pat. No. 3,727,114, entitled "Air Cooled Semiconductor Stack", issued to Oshima. The devices in the referenced patents require accurate positioning and/or stacking of the elements to be cooled and complex cooling structures not easily removed from engagement with the semiconductors after installation. The Koltuniak, et al. disclosure, for instance, comprises an integrally cast structure including an elongated longitudinal web having a plurality of bores through which a plurality of crystal-type diodes are mounted. The heat sink is further required to be mounted in an elevated manner upon posts attached to the supporting surface, after which the diodes must be installed. The Oshima disclosure discloses a structure that is used only with a pressure contact type semiconductor stack. The complexity of both of these inventions require special considerations in their fabrication which make them costly.

What is needed for present and future technology is a cooling device having characteristics which include high thermal conductivity, easy installation and removal, adaptable for engagement with and cooling of a multiplicity of densely populated solid state components, without requiring special construction of the components for mating with and locking onto the cooling device.

The present invention is directed to a device which includes all of the above named characteristics.

SUMMARY OF THE INVENTION

The present invention relates to a cooling device for the removal and dissipation of heat generated by solid state components and more particularly to a device for facilitating the cooling of a multiplicity of densely packed solid state components attached to a printed circuit board. The cooling device is an elongated, thermally conductive channel member, having at least two longitudinally connected side portions for functionally engaging the device into intimate contact with the solid state components to be cooled. The elongated channel member provides a defined path for a cooling medium through which heat is conducted away from the components and dissipated.

Accordingly, it is an object of this invention to provide an improved cooling device which is inexpensive and simple to fabricate.

It is another object of this invention to provide an improved cooling device for use with solid state components and which can be easily installed and which will retain itself in position once installed.

It is a further object of this invention to provide a cooling device which can engage with and simultaneously conduct thermal energy away from a multiplicity of solid state components mounted on a printed circuit board.

It is yet another object of this invention to provide an improved cooling device for use with solid state components which can be easily removed in the event replacement of any of the components is required.

A further object of this invention is to provide a cooling device which increases the heat transfer area exposed to air movement provided by conventional air cooling systems.

Other advantages and features of the invention become readily understood when taken in connection with the description, drawings and claims, which form a part of the present application.

BRIEF DESCRIPTION OF THE DRAWINGS

FIG. 1 is a perspective view of one form of the solid state component cooling device embodied in this invention;

FIG. 2 is a sectional view of the cooling device shown in FIG. 1, taken along the section lines 2—2;

FIG. 3 shows an end view of the cooling device of FIGS. 1 and 2 installed between two rows of solid state components mounted upon a printed circuit board;

FIG. 4 is a perspective view showing a multiplicity of the cooling devices installed in place between rows of solid state components mounted on a printed circuit board;

DESCRIPTION OF THE PREFERRED EMBODIMENTS

Figure 5:
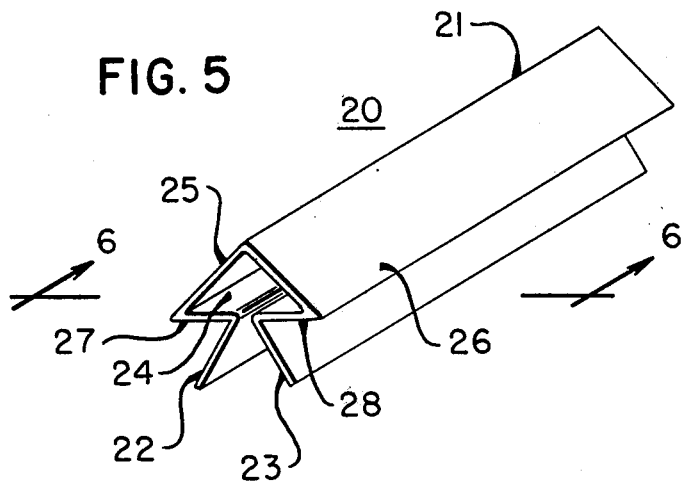
FIG. 5 is a perspective view of an alternate form of the solid state component cooling device embodied in the present invention.

Referring now to the drawings of a number of preferred embodiments, in which similar reference numerals are used throughout different views of each embodiment, each of which are identified and described separately hereinafter. All of the embodiments have the common characteristics of being formed from a single rectangular strip of resilient springlike material, cut to lengths suitable for the utility required and fabricated from thermally conductive material, preferably aluminum or aluminum alloy, which may be tempered, plated, anodized, painted, heat treated or unfinished. All embodiments illustrated in FIGS. 1-13 may be formed to the desired shape by conventional bending, forming and cutting methods commonly in use.

Referring now to the cooling device 10 of FIG. 1, a tubular structure 11 is formed by crimping a rectangular plate of sheet metal around an elongated die of suitable shape, leaving flared sides 12 and 13 open at an angle which increases in a direction away from the main tubular structure thus formed. The apex of the angle of the flared sides 12 and 13 converge toward the center of the tubular structure 11 along its longitudinal axis. The entire structure is processed by conventional metallurgical methods to impart a springlike characteristic, which when sides 12 and 13 are moved together and subsequently released, they will return to the position illustrated. After removal from the forming die, tubular cavity 14 resulting from forming process remains open along the entire longitudinal axis, thus providing a channel for the flow of air therethrough, and, in addition, for increasing the surface area for heat dissipation. FIG. 2 shows a sectional end view of the embodiment taken along the lines 2—2 of FIG. 1.

Referring now to FIG. 3, an end view of the cooling device 10 is shown inserted into position into a gap between two rows of solid state components 15 which are aligned and mounted upon a printed circuit board. It will be noted that sides 12 and 13 are compressed together with the springlike force urging them into intimate contact with the walls of the solid state devices on each side. It will be further noted that the sides 12 and 13 do not extend to the surface of the printed circuit board. The perimeter of the tubular structure 11 prevents sides 12 and 13 from engaging with any printed circuits residing on the surface of the printed circuit board 16, thereby preventing unwanted short circuits.

Referring now to FIG. 4, it can be seen that one or more of the cooling devices 10 of the present invention can be utilized to dissipate thermal energy radiated from and conducted through the walls of solid state components 15 which are densely mounted in rows on the printed circuit board 16.

Figure 6:
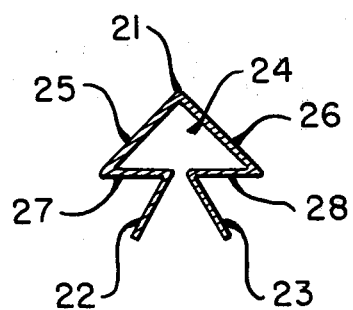
FIG. 6 is a sectional view of the cooling device shown in FIG. 5, taken along the lines 6—6.
Figure 7:
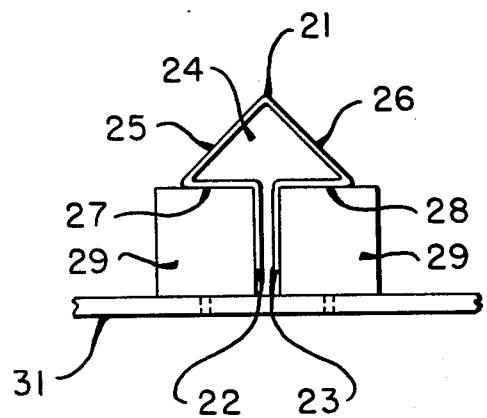
FIG. 7 shows an end view of the cooling device of FIGS. 5 and 6 installed in place between two rows of solid state components mounted on a printed circuit board.

In a second preferred embodiment 20 as illustrated in FIG. 5, the surfaces 25, 26, 27 and 28 cooperate to form a triangular body 21 containing a cavity 24 of like shape extending along the entire longitudinal axis. Flared sides 22 and 23 are spread at an angle along the longitudinal axis, forming a slightly open apex at the center of the base of the triangular body 21. FIG. 6 shows a sectional view of embodiment 20 taken along the lines 6—6 of FIG. 5. FIG. 7 illustrates an end view of embodiment 20 installed in the space between two adjacent rows of solid state components 29, which are affixed to printed circuit board 31. It will be noted that this embodiment engages sides 22 and 23 into intimate contact with the adjacent sides of the solid state components 29, maintaining this contact by the force imparted by the springlike characteristics of sides 22 and 23, which have as their normal position, an angle such as illustrated in FIGS. 5 and 6. Surfaces 27 and 28 are also placed into intimate contact with at least one half of the top surfaces of solid state components 29, providing additional areas of conduction and radiation for dissipation of thermal energy generated within the solid state components. Embodiment 20 regains the shape shown in FIGS. 5 and 6 when it is withdrawn from its installed position, due to the springlike characteristic imparted to it while it is being fabricated.

Figure 8:
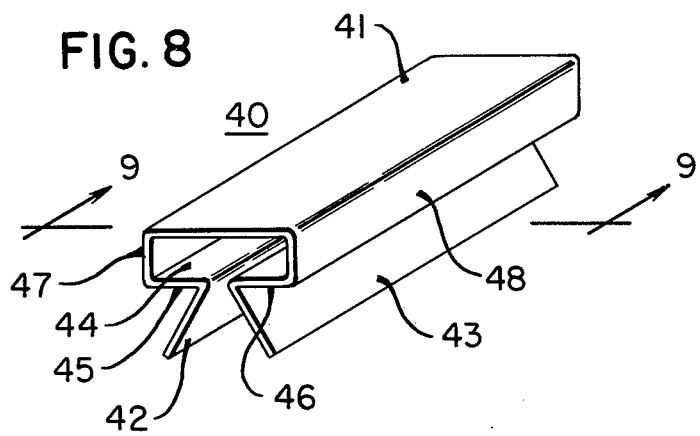
FIG. 8 is a perspective view of another alternate form of the solid state component cooling device embodied in this invention.
Figure 9:
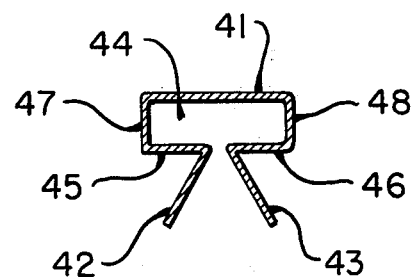
FIG. 9 is a sectional view of the cooling device shown in FIG. 8, taken along the lines 9—9.
Figure 10:
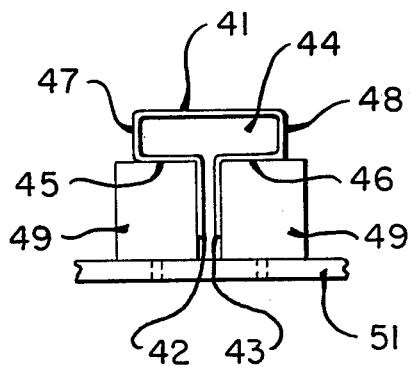
FIG. 10 shows an end view of the cooling device of FIGS. 8 and 9 installed in place between two rows of solid state components mounted on a printed circuit board.
Figure 11:
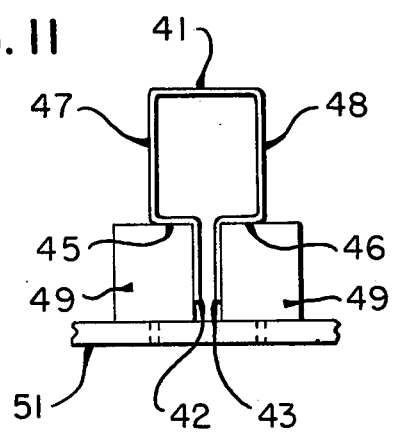
FIG. 11 is an end view showing the cooling device of FIG. 10 with alternate dimensions.

In a third preferred embodiment 40, as shown in FIGS. 8, 9 and 10, it will be noted that the shape of the tubular structure formed by the surfaces 41, 45, 46, 47 and 48 is rectangular in nature. The cross-sectional opening of the cavity thus formed along the longitudinal axis of the structure may vary according to requirements and the dimensions of the forming die used in fabrication. FIG. 11 demonstrates one of many dimensional shapes, which can vary between a horizontally oriented rectangular cross-section such as that illustrated in FIG. 10 and a vertically oriented rectangular cross-section such as is pictured by FIG. 11. As can be readily seen from the illustration, the surface area for dissipating thermal energy can be increased or decreased to meet variations in requirements.

Embodiments 10, 20 and 40 are especially suitable for use with solid state components of the single inline package (SIP) type where the circuit pins protrude from the bottom surface of the component and are inserted directly into the printed circuit board.

Figure 12:
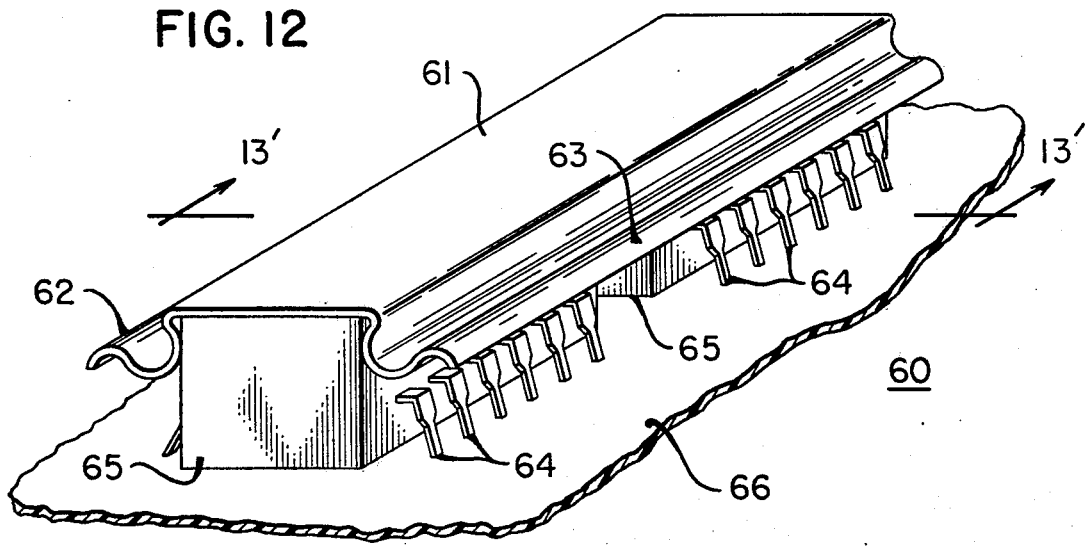
FIG. 12 is a perspective view of yet another alternate form of the solid state cooling device embodied in the present invention.
Figure 13:
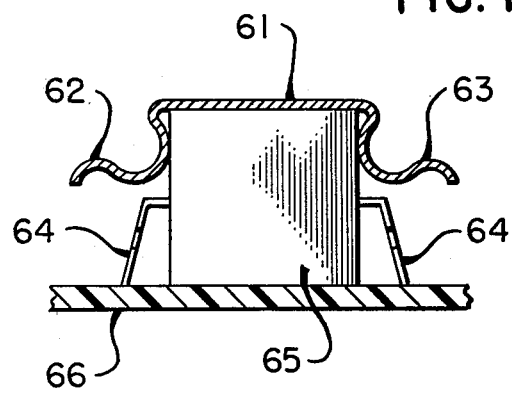
FIG. 13 is a sectional view of the cooling device shown in FIG. 12, taken along the lines 13'—13', installed in place upon a solid state component mounted upon a printed circuit board.

An alternate embodiment 60, as illustrated in FIG. 12, is more suitable for conducting and dissipating thermal energy away from a row of solid state components 65 of the dual inline package (DIP) type. Dual inline package components have leads 64 extending from their sides, which prevents placement of these components side by side in very close proximity on a printed circuit board 66. They may, however, be installed in a row, end-to-end, in close proximity. The sides 62 and 63 of embodiment 60 form corrugated ear-like extensions of the planar surface 61 which engages the top surfaces of the dual inline packages 65 in close contact. The curved portion of sides 62 and 63 are displaced outwardly away from the sides of the solid state component packages 65 when press fit over the top surfaces. The springlike characteristic of the sides 62 and 63 presents a force toward the center of the solid state components, which force serves to retain the cooling device 60 in its installed position. This characteristic is readily apparent from the end view of the device 60 as illustrated in FIG. 13.

All of the embodiments of the present invention are easily manually installed and removed without the need for special tools or a high degree of skill.

While but four preferred embodiments of the present invention have been disclosed specifically herein for purposes of illustration, it is readily apparent that many modifications and variations may be made which do not constitute departures from the true spirit and scope of the present invention.

What is claimed is:

1. A method of cooling a multiplicity of solid state components mounted in parallel rows upon a printed circuit board, comprising:
    insertion of a heat exchange means between adjacent pairs of said parallel rows of said solid state components; and
    conduction of radiated heat away from said adjacent pairs of said parallel rows of said solid state components.

2. In a semiconductor memory system, an improved cooling method comprising:
    arranging a plurality of semiconductor memory devices into close proximity in parallel rows on a printed circuit board;
    inserting an elongated channel member having an air passageway and two thermally conductive side portions longitudinally connected to said elongated channel member between two of said parallel rows of semiconductor memory devices;
    engageably contacting the tops and opposing sides of said two of said parallel rows of said semiconductor memory devices for providing a conductive path for carrying away heat generated by said two of said parallel rows of said semiconductor memory devices; and
    means for retaining said elongated channel member into engagement between said two parallel rows of said semiconductor memory devices.

3. The improved cooling system of claim 2, wherein said means for retaining said elongated channel member into engagement between said two parallel rows of said semiconductor memory devices is provided by a resilient springlike characteristic of said elongated channel member.

4. In a semiconductor memory system:
    a printed circuit board;
    a plurality of semiconductor memory devices attached to said printed circuit board, said plurality of semiconductor memory devices arranged in adjacent parallel rows; and
    an insertable elongated channel member having longitudinally connected, thermally conductive side portions engaging opposing sides and top surfaces of two of said parallel rows of said semiconductor memory devices and for carrying away heat generated by said two parallel rows of said semiconductor memory devices.

5. The insertable elongated channel member of claim 4, wherein said longitudinally connected, thermally conductive side portions are formed from a material having a resilient springlike characteristic for retaining said insertable elongated channel member into engagement with said opposing sides and top surfaces of said two parallel rows of said semiconductor memory devices.

* * * * *